(12) United States Patent
Ochiai

(10) Patent No.: US 11,838,664 B2
(45) Date of Patent: Dec. 5, 2023

(54) SEMICONDUCTOR DEVICE, SYSTEM, AND DEVICE USING THE SAME

(71) Applicant: Canon Kabushiki Kaisha, Tokyo (JP)

(72) Inventor: Kei Ochiai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 17/161,922

(22) Filed: Jan. 29, 2021

(65) Prior Publication Data

US 2021/0243398 A1  Aug. 5, 2021

(30) Foreign Application Priority Data

Jan. 30, 2020 (JP) ................................ 2020-013956

(51) Int. Cl.
| | |
|---|---|
| *H04N 25/75* | (2023.01) |
| *H03G 3/30* | (2006.01) |
| *H03F 3/04* | (2006.01) |
| *H03M 1/12* | (2006.01) |

(52) U.S. Cl.
CPC ............... *H04N 25/75* (2023.01); *H03F 3/04* (2013.01); *H03G 3/30* (2013.01); *H03M 1/12* (2013.01)

(58) Field of Classification Search
CPC .......... H04N 5/378; H04N 25/75; H03F 3/04; H03F 2203/45514; H03F 3/45475; H03F 3/70; H03G 3/30; H03M 1/12; H03M 1/0604; H03M 1/123; H03M 1/56
See application file for complete search history.

(56) References Cited

U.S. PATENT DOCUMENTS

| | | | | |
|---|---|---|---|---|
| 9,380,235 | B2* | 6/2016 | Sato ...................... | H03M 1/466 |
| 2006/0001564 | A1* | 1/2006 | Yamagata ........... | H03M 1/0619 |
| | | | | 341/169 |
| 2006/0214821 | A1* | 9/2006 | Roh .................... | H03M 1/1071 |
| | | | | 341/50 |
| 2008/0291072 | A1 | 11/2008 | Sano | |
| 2009/0244328 | A1* | 10/2009 | Yamashita ............ | H04N 5/357 |
| | | | | 348/241 |
| 2011/0114827 | A1* | 5/2011 | Yamaoka ................ | H03K 7/08 |
| | | | | 250/214 R |
| 2011/0194003 | A1* | 8/2011 | Saito ...................... | H04N 5/335 |
| | | | | 348/294 |

(Continued)

FOREIGN PATENT DOCUMENTS

| | | |
|---|---|---|
| JP | 2009005338 A | 1/2009 |
| JP | 2010193113 A | 9/2010 |

(Continued)

OTHER PUBLICATIONS

Japanese Office Action dated Aug. 29, 2023 in counterpart Japanese Patent Appln. No. 2020-013956.

*Primary Examiner* — Jason A Flohre
(74) *Attorney, Agent, or Firm* — Venable LLP

(57) ABSTRACT

A semiconductor device comprising: a voltage generator configured to generate a voltage; a first analog-to-digital (AD) converter configured to convert an analog value based on a voltage generated by the voltage generator into a first digital value; and a second AD converter configured to convert an analog value based on a voltage generated by the voltage generator into a second digital value, wherein the voltage generator generates voltages by dividing a power supply voltage by resistive elements.

24 Claims, 9 Drawing Sheets

(56) References Cited

U.S. PATENT DOCUMENTS

| | | | |
|---|---|---|---|
| 2012/0194718 A1* | 8/2012 | Sato | H04N 5/3572 |
| | | | 348/294 |
| 2012/0212657 A1* | 8/2012 | Mo | H04N 5/3658 |
| | | | 348/300 |
| 2015/0009380 A1* | 1/2015 | Kobayashi | H04N 5/378 |
| | | | 348/302 |
| 2015/0138413 A1* | 5/2015 | Sato | H03M 1/14 |
| | | | 341/155 |
| 2017/0230598 A1* | 8/2017 | Takayanagi | H04N 5/369 |
| 2017/0374307 A1* | 12/2017 | Kim | H04N 5/378 |
| 2018/0184018 A1* | 6/2018 | Itano | H04N 5/37457 |
| 2020/0020726 A1* | 1/2020 | Anas | H01L 27/14605 |
| 2021/0218925 A1* | 7/2021 | Nagaki | H04N 25/677 |

FOREIGN PATENT DOCUMENTS

| | | |
|---|---|---|
| JP | 2011-166287 A | 8/2011 |
| JP | 2015-015609 A | 1/2015 |
| JP | 2017079464 A | 4/2017 |
| WO | 2019/235033 A1 | 12/2019 |

* cited by examiner

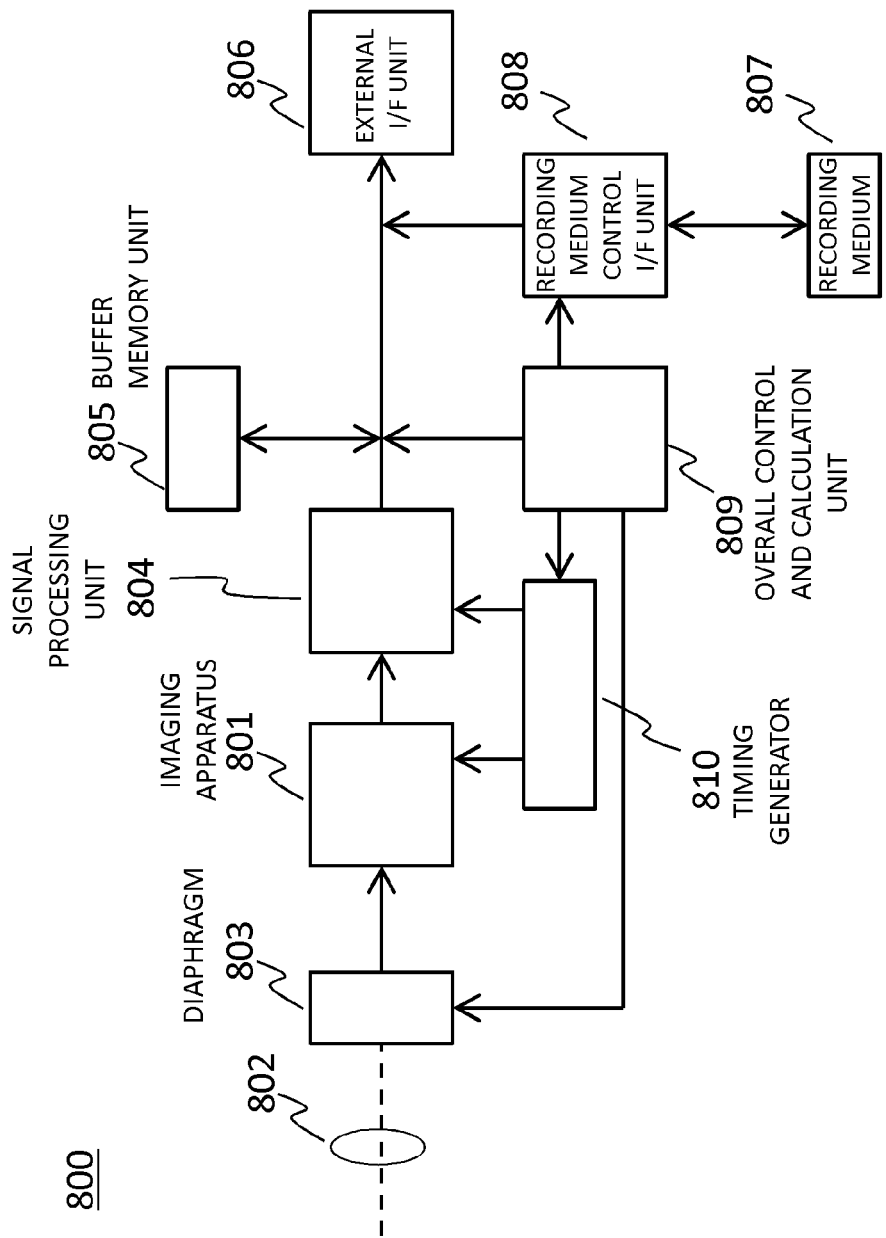

SEMICONDUCTOR DEVICE, SYSTEM, AND DEVICE USING THE SAME

BACKGROUND OF THE INVENTION

Field of the Invention

The present invention relates to a semiconductor device and a system and equipment that use the semiconductor device.

Description of the Related Art

Signal processing such as amplification and AD conversion is performed by various semiconductor devices. There has been known a solid-state imaging apparatus (a semiconductor device) in which a plurality of gains is applied to a single pixel signal generated by a pixel to achieve a wide dynamic range.

The pixel signal amplified by an amplifier circuit is converted into a digital signal by an AD converter, and the digital signal is divided in accordance with the gain used in the amplifier circuit to extend the dynamic range of the solid-state imaging apparatus.

Japanese Patent Application Publication No. 2017-79464 describes means for acquiring a correction value to correct a gain error of an amplifier circuit that amplifies a pixel signal.

SUMMARY OF THE INVENTION

The first aspect of the disclosure is a semiconductor device comprising: a voltage generator configured to generate a voltage; a first analog-to-digital (AD) converter configured to convert an analog value based on a voltage generated by the voltage generator into a first digital value; and a second AD converter configured to convert an analog value based on a voltage generated by the voltage generator into a second digital value, wherein the voltage generator generates voltages by dividing a power supply voltage by resistive elements.

The second aspect of the disclosure is a system comprising: a signal generator configured to generate a signal corresponding to an input from outside; a voltage generator configured to generate a voltage; a first AD converter configured to convert an analog value base on a voltage generated by the voltage generator into a first digital value; a second AD converter configured to convert an analog value based on a voltage generated by the voltage generator into a second digital value; and a third AD converter configured to convert an analog value based on the signal generated by the signal generator into a third digital value, wherein the third digital value is corrected based on a ratio between the first digital value and the second digital value.

Further features of the present invention will become apparent from the following description of exemplary embodiments (with reference to the attached drawings).

BRIEF DESCRIPTION OF THE DRAWINGS

FIG. 8 is a block diagram illustrating a configuration of an imaging system according to a third embodiment.

DESCRIPTION OF THE EMBODIMENTS

To obtain a correction value more accurately, there is a demand for a technique for reducing the impact of variations in AD conversion gain per individual attributed to manufacturing variations or the like and changes in AD conversion value caused by power supply voltage fluctuations or the like.

The present disclosure provides an advantageous technique for improving the accuracy of AD conversion.

EMBODIMENTS

First Embodiment

Figure 1:
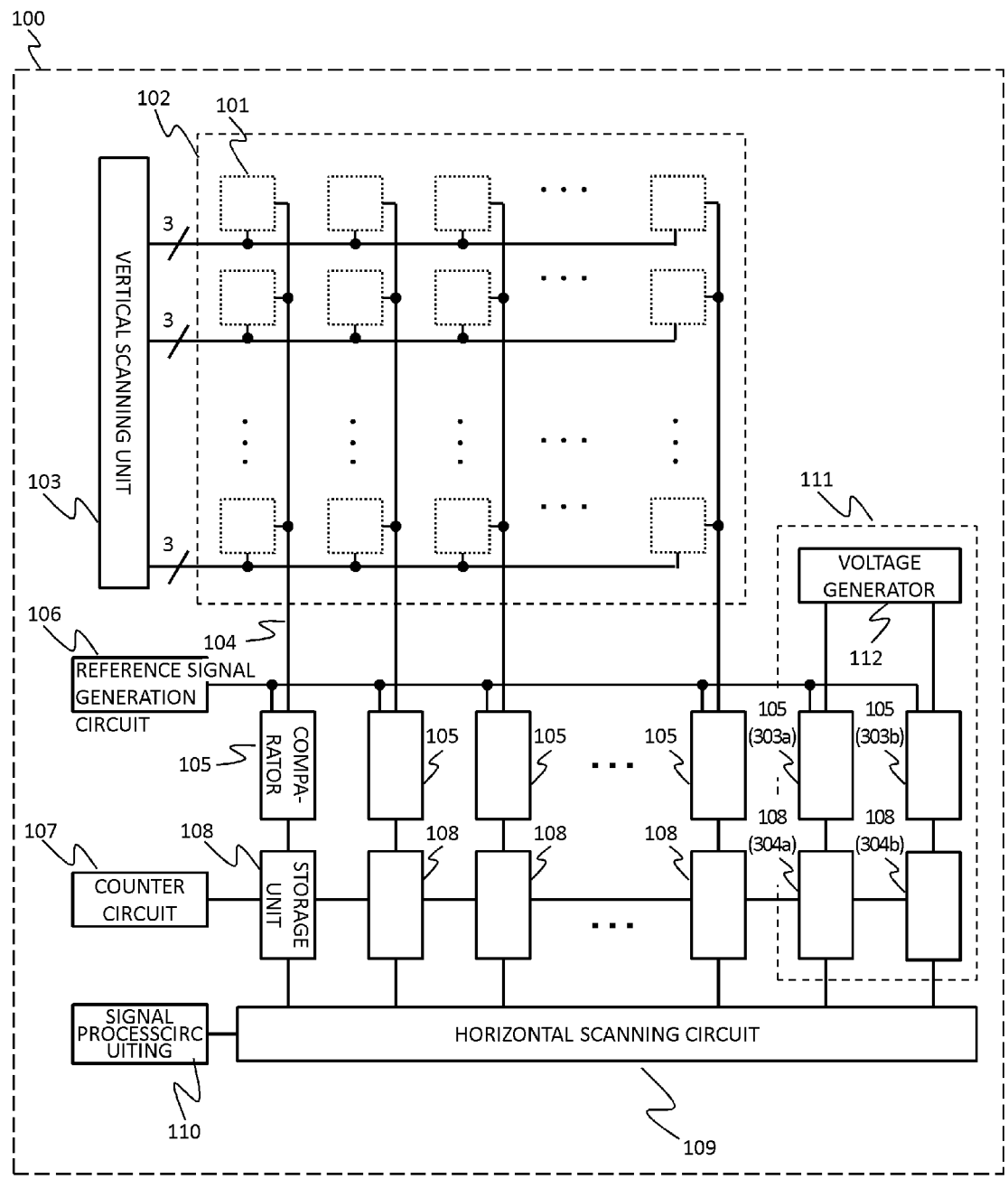
FIG. 1 is a circuit diagram of a semiconductor device according to a first embodiment.

FIG. 1 is a circuit diagram of a semiconductor device 100 according to a first embodiment. The semiconductor device 100 is a photoelectric conversion apparatus such as a CMOS area sensor and includes a signal generator 102 in which unit pixels 101 are arranged in a two-dimensional matrix. The signal generator 102 may also be referred to as a pixel unit or a pixel array. The photoelectric conversion apparatus can be used as an imaging apparatus, a distance measuring apparatus, or a light measuring apparatus. As an example of the semiconductor device 100, an imaging apparatus will be described. The present embodiment is applicable not only to an imaging apparatus but also to various signal processing apparatuses such as an acoustic apparatus, a display apparatus, and a measuring apparatus. The signal generator 102 generates a signal corresponding to an input from outside. In the present embodiment, the signal generator 102 generates a signal corresponding to incident light from outside. The semiconductor device 100 also includes a vertical scanning unit 103, vertical output lines 104, comparators 105, a reference signal generation circuit 106, a counter circuit 107, storage units 108, a horizontal scanning circuit 109, a signal processing circuit 110, and a correction value output circuit 111. In addition, the correction value output circuit 111 includes a voltage generator 112.

Figure 2:
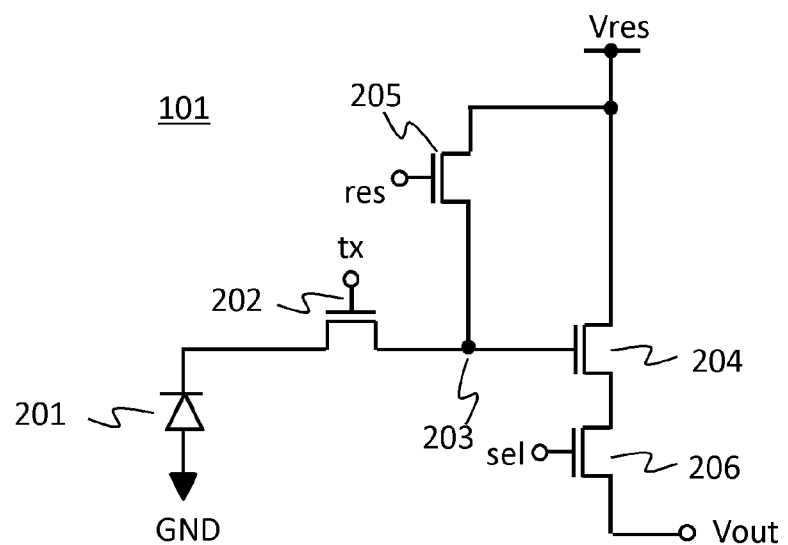
FIG. 2 is a circuit diagram of a unit pixel according to the first embodiment.

A configuration of the unit pixel 101 will be described with reference to FIG. 2. The unit pixel 101 includes a photodiode 201, a transfer gate 202, a floating diffusion unit 203, a floating diffusion amplifier 204, a reset switch 205, and a pixel selection switch 206. The unit pixel 101 outputs a pixel value (a pixel output), which is an analog value corresponding to light incident on the photodiode 201.

The photodiode (hereinafter, referred to as the PD) 201 photoelectrically converts an incident light signal and accumulates charges in accordance with the exposure amount. When a signal tx is set to a high level, the transfer gate 202 transfers the charges accumulated in the PD 201 to the floating diffusion (hereinafter, referred to as the FD) unit 203. The FD unit 203 is connected to a gate of the floating diffusion amplifier (hereinafter, referred to as the FD amplifier) 204. The FD amplifier 204 converts the charge amount transferred from the PD 201 into a voltage amount. The reset switch 205 is a switch for resetting the FD unit 203. By setting a signal res to a high level, the FD unit 203 is reset to a reset voltage Vres. In addition, to reset the charges in the PD 201, the signal res and the signal tx are simultaneously set to the high level. This turns on both the transfer gate 202 and the FD reset switch 205 and resets the PD 201 to the reset voltage Vres via the FD unit 203. When a signal sel is set to a high level, the pixel selection switch 206 outputs a pixel value Vout, which is converted into a voltage by the FD amplifier 204, as an image signal.

Referring back to FIG. 1, the description will be continued. The vertical scanning unit 103 provides each unit pixel 101 with a drive signal such as the signal res, tx, or sel, which controls the corresponding switch in the unit pixel 101. These drive signal are common for each row.

The individual pixel output Vout is connected to the comparator 105 via the vertical output line 104 in each column. The individual comparator 105 arranged in each column receives the output Vout and a reference signal having a ramp waveform, which is generated and provided by the reference signal generation circuit 106. The individual comparator 105 includes a differential input comparator that compares the magnitude of the voltages of the output Vout and the reference signal, and when the magnitude relation between the signal voltages is reversed, the comparator 105 causes the output to transition from a high level to a low level or from the low level to the high level. The reference signal generation circuit 106 is connected in common to a plurality of comparators 105. The counter circuit 107 is connected in common to a plurality of storage units 108, performs a counting operation in accordance with the output of a reference signal from the reference signal generation circuit 106, and outputs a count value. The individual storage unit 108 stores the count value outputted from the counter circuit 107 as digital data at a timing when the corresponding comparator 105 reverses the output voltage. Namely, the comparator 105, the reference signal generation circuit 106, the counter circuit 107, and the storage unit 108 constitute an AD converter (a third AD converter) that converts a pixel output Vout in an analog value into a digital value.

The horizontal scanning circuit 109 sequentially transfers the digital data stored in the individual storage unit 108 to the signal processing circuit 110 per column.

A series of operations of reading the pixel values from these pixels is performed while the vertical scanning unit 103 selects the pixel row of the signal generator 102. A timing generator that controls a pulse needed for each circuit and its timing is omitted in FIGS. 1 and 2.

A configuration of the correction value output circuit 111 will be described with reference to FIG. 3. The correction value output circuit 111 includes the voltage generator 112, comparators 303a and 303b, and storage units 304a and 304b.

The voltage generator 112 generates a predetermined voltage that is used as a reference voltage. The voltage generator 112 is configured to generate the reference voltage by using only passive elements, namely, without using active elements. In other words, the voltage generator 112 does not need to include any active elements. The voltage generator 112 is configured with only passive elements such as a resistive element and a capacitive element. This configuration is better since the active element has less variation in properties than the passive element. The voltage generator 112 generates analog reference voltages Vvola and Vvolb by dividing a power supply voltage by resistive elements and outputs the generated reference voltages. The voltage generator 112 includes, for example, resistive elements R1, R2, and R3 whose resistance values are r1, r2, and r3, respectively, voltage followers 301a and 301b each of which has a gain of 1, and switches 302a and 302b. The voltage generator 112 is supplied with a power supply voltage Vdd from a voltage source. This voltage source of the voltage generator 112 is different from a voltage source of the signal generator 102. The power supply voltage Vdd is divided by the resistances R1, R2, and R3 at a ratio of r1:r2:r3 and inputted to the voltage follower 301a as the voltage Vvola expressed by equation (1) and to the voltage follower 301b as the voltage Vvolb expressed by equation (2). The voltage Vvola and the voltage Vvolb correspond to voltages (a first voltage and a second voltage) generated by the voltage generator 112.

$$Vvola = (r2+r3)/(r1+r2+r3) \times Vdd \quad (1)$$

$$Vvolb = r3/(r1+r2+r3) \times Vdd \quad (2)$$

Namely, the voltages inputted to the voltage followers 301a and 301b are determined by the ratio of the resistances R1, R2, and R3. Since the amount of variation in the resistance value due to manufacturing variations is typically equal between the neighboring resistive elements, even when the resistance value itself changes, the ratio of the resistance values r1, r2, and r3 does not change, and an approximately constant voltage value is always inputted to the voltage followers 301a and 301b. The voltage followers 301a and 301b have high input impedance and output the voltage values equal to the input voltage values expressed by the equation (1) and the equation (2).

Switches 302a and 302b determine whether to connect the respective outputs from the voltage followers 301a and 301b to the subsequent stage. The switches 302a and 302b are controlled to be turned on or off at a predetermined timing by a pulse signal from the timing generator (not illustrated).

Output units of the voltage followers 301a and 301b are connected to the comparators 303a and 303b via the switches 302a and 302b. The comparators 303a and 303b and the storage units 304a and 304b have the same configurations as the comparator 105 and the storage unit 108 illustrated in FIG. 1. The analog values outputted from the voltage followers 301a and 301b are stored in the storage units 304a and 304b as digital data. Namely, the comparator 303a, the reference signal generation circuit 106, the counter circuit 107, and the storage unit 304a constitute a first AD converter. In addition, the comparator 303b, the reference signal generation circuit 106, the counter circuit 107, and the storage unit 304b constitute a second AD converter. The first AD converter converts a first analog value (Vvola) based on the first voltage into a first digital value. The second AD converter converts a second analog value (Vvolb) based on the second voltage into a second digital value.

Figure 3:
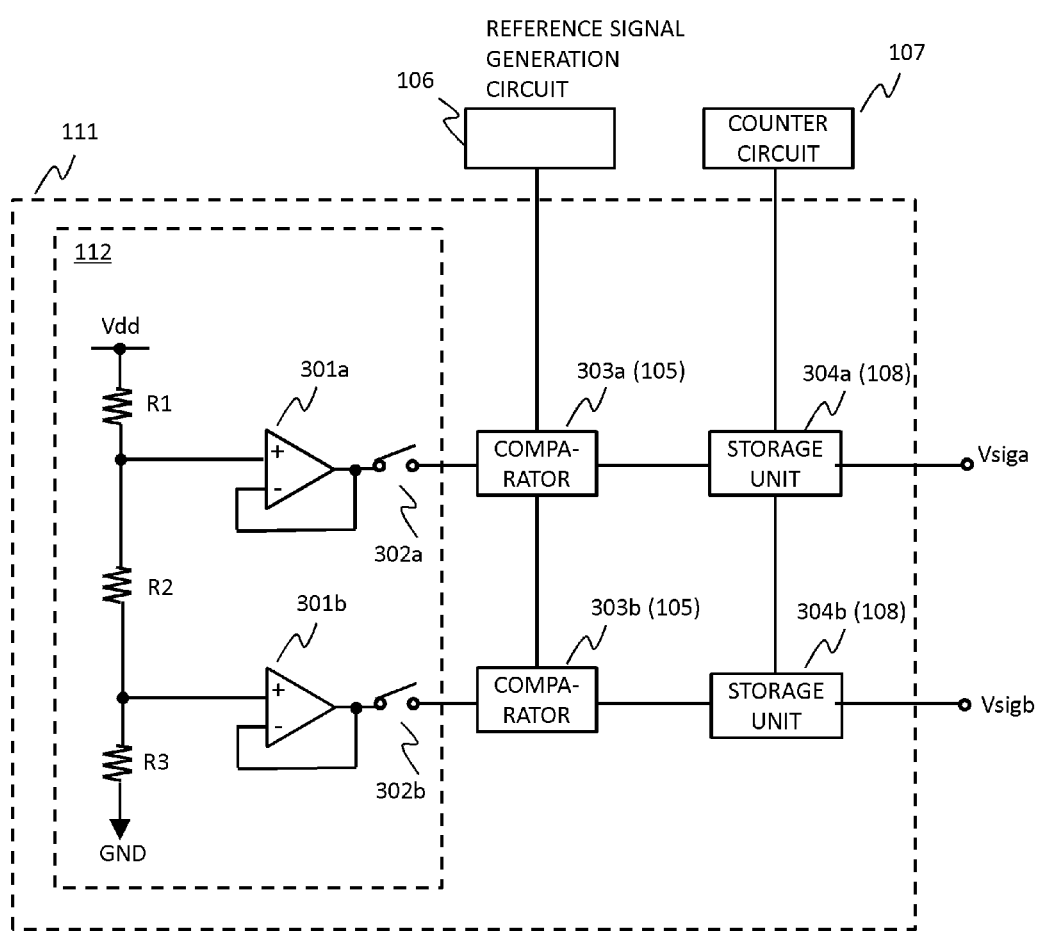
FIG. 3 is a circuit diagram of a correction value output circuit according to the first embodiment.

As illustrated in FIG. 3, data stored in the storage unit 304a and data stored in the storage unit 304b are referred to as Vsiga and Vsigb, respectively. As described above, when the magnitude relation between the voltage of the input signal to the comparator 105 and the voltage of the reference signal, which is generated by the reference signal generation circuit 106 and has a ramp waveform, is reversed, the comparator 105 reverses its own output potential. The storage unit 108 stores a count value obtained at the time when the comparator 105 reverses the output potential as digital data. Consequently, in a case where the voltage change amount per unit time of the ramp waveform is not constant, a variation may occur between the input analog value and the stored digital value. In particular, an individual difference could be generated in the gradient of the ramp waveform generated by the reference signal generation circuit 106 due to the manufacturing variations. As a result, a difference between the input analog value and the stored digital value is generated per individual. This difference will be referred to as an AD gain error.

The correction value output circuit 111 can output a highly accurate correction value for correcting the AD gain error of each individual. Hereinafter, a method for calculating a correction value for correcting the AD gain error will be described.

Vsiga stored in the storage unit 304a is expressed by equation (3) that uses Vvola in the equation (1) and an AD gain error a, which occurs when the Vvola is AD-converted.

$$Vsiga = Vvola \times (AD \text{ gain error } a) \quad (3)$$

In contrast, Vsigb stored in the storage unit 304b is expressed by equation (4) that uses Vvolb in the equation (2) and an AD gain error b, which occurs when the Vvolb is AD-converted.

$$Vsigb = Vvolb \times (AD \text{ gain error } b) \quad (4)$$

In the above equations, the Vvola and the Vvolb are known values determined based on the ratio of the resistive elements in the voltage generator 112 and the power supply voltage. Thus, the two digital values Vsiga and Vsigb, which correspond to the two known analog input values and include the AD gain errors, can be obtained by the equations (3) and (4). A gradient of the ramp waveform can be calculated with the Vsiga and the Vsigb, and by using this gradient value, the AD gain error of each individual can be corrected.

In practice, other than the AD gain error described above, changes of the digital value due to voltage fluctuations that occur when the AD conversion is performed can also generate an error in the digital value outputted by the AD converter. Even in the same individual, when the comparator 105, the reference signal generation circuit 106, the counter circuit 107, and the storage unit 108 are affected by the fluctuations of the power supply voltage, the reversal potential, the reference signal, the count value, and the digital data that are outputted from these components may change. This change of the digital data will be referred to as an AD conversion error. The AD conversion error varies depending on time at which the analog value is converted into the digital value. In other words, the same AD conversion error is superposed on the digital value that is AD-converted at the same time. To offset or reduce the impact of the AD conversion error superposed on the Vsiga and the Vsigb, the correction value output circuit 111 causes the first and second AD converters described above to operate at the same time and perform the AD conversion at the same timing. If the impact of the AD conversion error is included, the above equations (3) and (4) will be expressed as follows.

$$Vsiga = Vvola \times (AD \text{ gain error } a) \times (AD \text{ conversion error}) \quad (5)$$

$$Vsigb = Vvolb \times (AD \text{ gain error } b) \times (AD \text{ conversion error}) \quad (6)$$

Further, if a ratio between the equation (5) and the equation (6) is calculated, the term (AD conversion error) is cancelled, and thus, equation (7) is obtained.

$$Vsiga/Vsigb = (Vvola \times (AD \text{ gain error } a))/(Vvolb \times (AD \text{ gain error } b)) \quad (7)$$

The semiconductor device 100 outputs a digital value (a third digital value) obtained by AD-converting an analog value outputted from a pixel and the ratio between Vsiga (a first digital value) and Vsigb (a second digital value). The Vsiga and the Vsigb may be obtained and outputted at any timing. For example, the Vsiga and the Vsigb may be obtained every time a line of pixel signals in the signal generator 102 is read, every time all the lines of pixel signals are read, or at timing when the power is turned on or an instruction from a user is received.

Thus, the output of the ratio between Vsiga and Vsigb enables the circuit downstream to correct the digital pixel signal based on this ratio between Vsiga and Vsigb. Specifically, the AD gain error can be corrected by using the ratio between Vsiga and Vsigb (the actual measured value) and its set value (the ratio between Vvola and Vvolb). According to the present embodiment, the impact of the AD conversion error can be offset or reduced, and the AD gain error of each individual can be accurately corrected.

Alternatively, instead of outputting the ratio between Vsiga and Vsigb, the semiconductor device 100 may individually output Vsiga and Vsigb or output a signal of a different value calculated based on Vsiga and Vsigb. In addition, the signal processing circuit 110 in the semiconductor device 100 may perform the correction of the AD gain error.

The above configuration described with reference to FIG. 1, etc. is merely a specific example for implementing the present disclosure, and the above specific example should not be construed as limiting the technical scope of the present disclosure. For example, the semiconductor device 100 may be configured to include a laminate substrate including a first substrate and a second substrate. The signal generator 102 including the unit pixels 101 is arranged on the first substrate. The comparators 105, the reference signal generation circuit 106, the counter circuit 107, the storage units 108, the horizontal scanning circuit 109, the signal processing circuit 110, and the correction value output circuit 111 may be arranged on the second substrate, and the vertical output lines 104 may be arranged to connect the first and second substrates. Adopting the laminate structure including the first and second substrates can provide advantageous effects such as increasing a speed of processing signals outputted from the unit pixels 101 and saving a space.

Modification of First Embodiment

Figure 4:
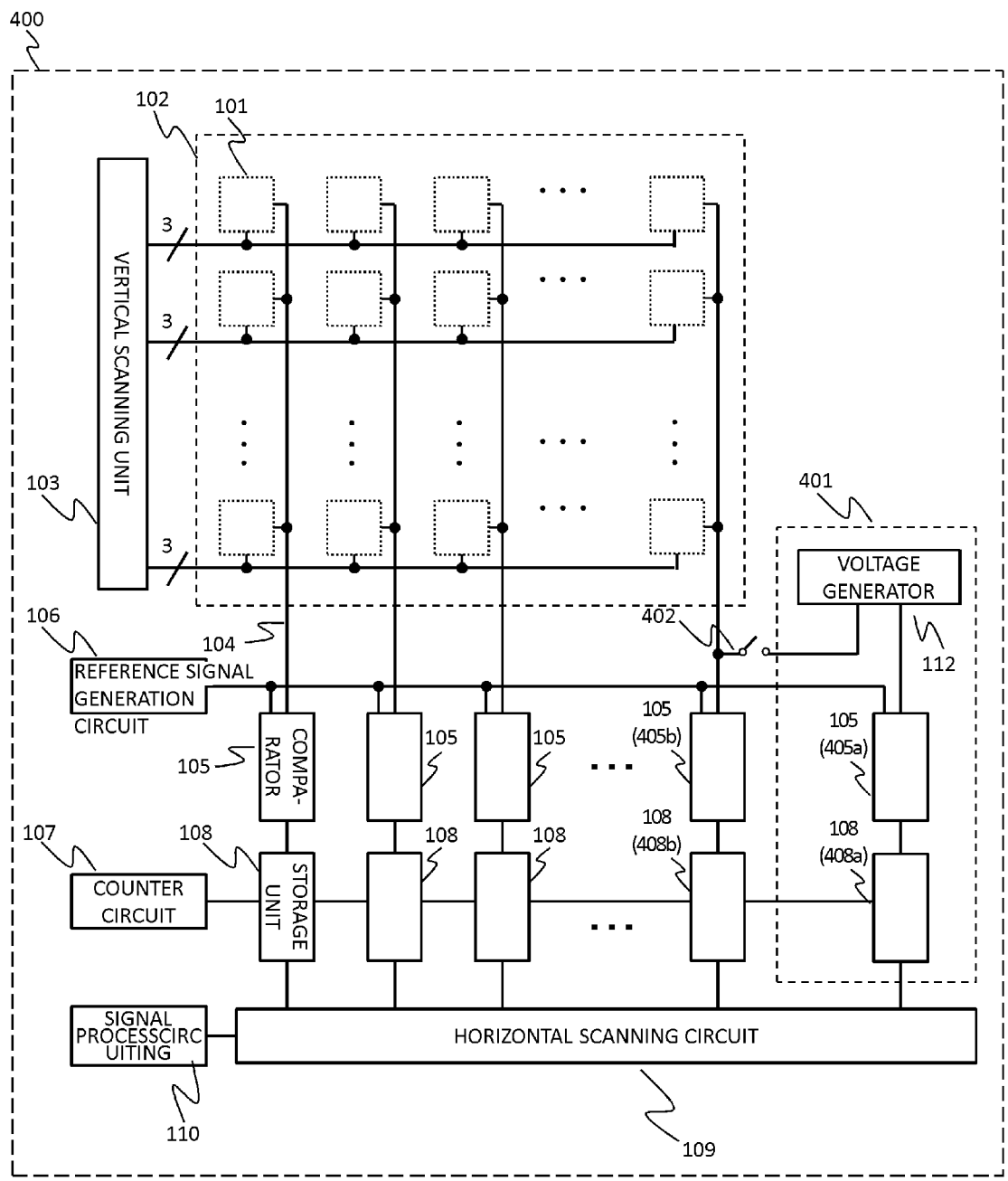
FIG. 4 is a circuit diagram of a semiconductor device according to a modification of the first embodiment.

A modification of the semiconductor device 100 will be described with reference to FIG. 4. Hereinafter, a semiconductor device 400 according to the present modification will be described mainly focusing on differences from the semiconductor device 100 according to the first embodiment, and descriptions of portions common to the semiconductor device 100 will be omitted.

The present modification is similar to the first embodiment in that a correction value output circuit 401 of the semiconductor device 400 includes a voltage generator 112. However, the correction value output circuit 401 includes only a single comparator 405a and a single storage unit 408a. In addition, a set of a comparator 405b and a storage unit 408b used for AD-converting and storing a pixel signal (a pixel value) is also used for outputting a correction value. The comparators 405a and 405b have the same configuration as a comparator 105. The storage units 408a and 408b have the same configuration as a storage unit 108. The semiconductor device 400 includes a switch 402 that selectively connects either the voltage generator 112 or a signal generator 102 to the comparator 405b. A voltage Vvola may be inputted to the comparator 405a, and a voltage Vvolb may be inputted to the comparator 405b. The reverse is also possible.

As described above, according to the present modification, Vvola or Vvolb outputted from the voltage generator 112 is inputted to the comparator and the storage unit that are usually used for performing the AD conversion of the pixel signal from the signal generator 102 via the switch 402. A method for correcting the AD gain error of each individual is the same as that described in the first embodiment. In this way, the space in the semiconductor device can be saved.

The comparator 405b, a reference signal generation circuit 106, a counter circuit 107, and the storage unit 408b can be regarded as an AD converter (a third AD converter) that converts a pixel signal or as an AD converter (a first AD converter or a second AD converter) that converts an output signal from the voltage generator 112.

The modification in which one of the output signals from the voltage generator 112 is inputted to the comparator 105 and the storage unit 108 that are used for performing the AD conversion of a pixel signal from the signal generator 102 has thus been described. Namely, the example in which either the first converter or the second converter operates as the third converter has been described. However, both the first converter and the second converter may operate as the third converter. In this case, the semiconductor device 100 is configured to include a first switch that selectively connects either the voltage Vvola or the pixel output Vout to the first converter and a second switch that selectively connects either the voltage Vvolb or the pixel output Vout to the second converter. Specifically, compared with the configuration illustrated in FIG. 4, the semiconductor device 400 further includes another switch, and two output signals from the voltage generator 112 are inputted to the comparators 105 and the storage units 108 that are used for performing the AD conversion of the pixel signals from the signal generator 102.

Second Embodiment

A semiconductor device according to a second embodiment will be described focusing on the difference between the first and second embodiments.

Figure 5:
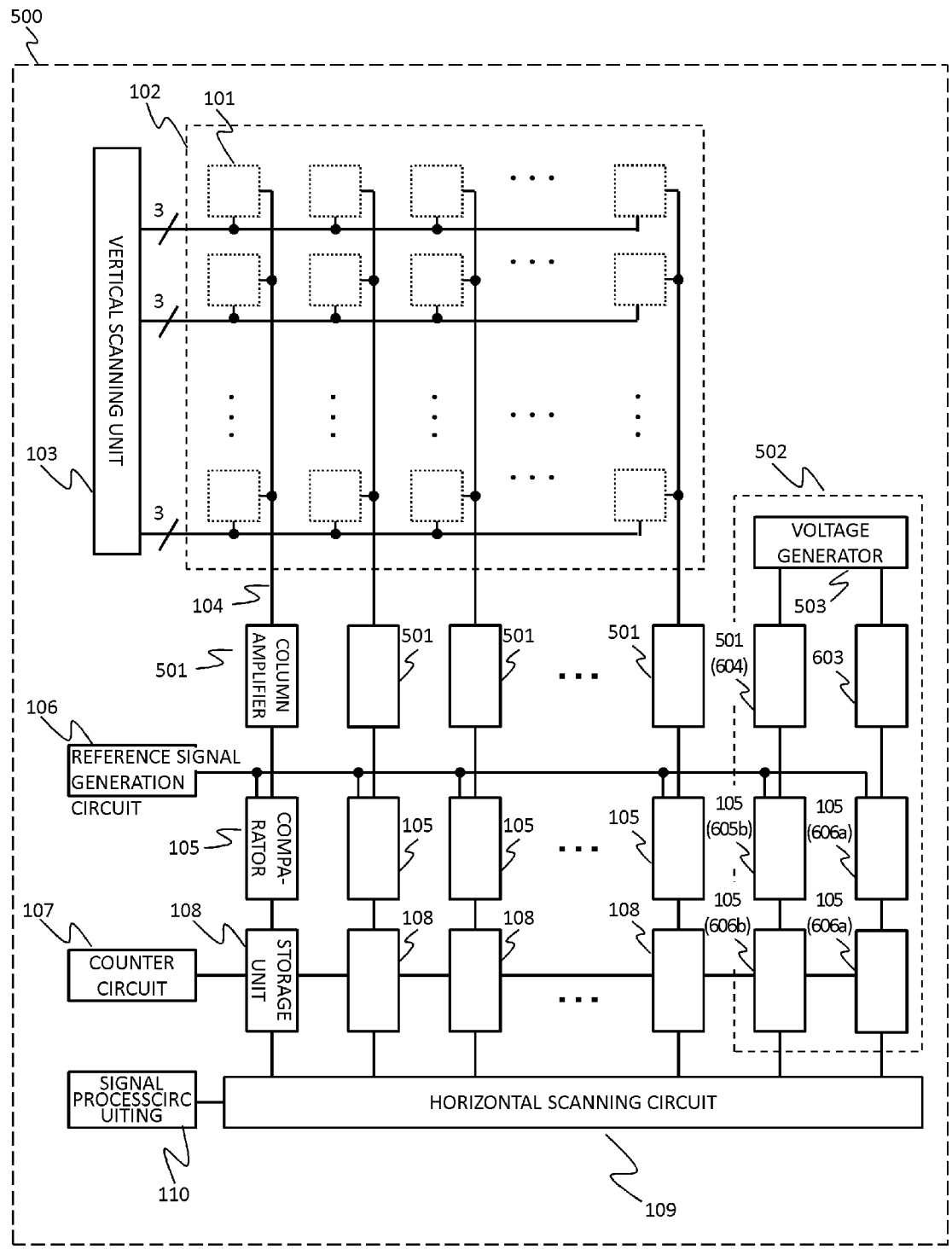
FIG. 5 is a circuit diagram of a semiconductor device according to a second embodiment.

FIG. 5 is a circuit diagram of a semiconductor device 500 according to the present embodiment. The semiconductor device 500 includes a column amplifier 501 (a third amplifier) connected to a vertical output line 104 in each column. The column amplifier 501 has a variable gain. The semiconductor device 500 performs an operation of switching the gain of the column amplifier 501 in accordance with the level of a pixel output Vout outputted to the vertical output line 104.

For example, in a case where the level of the pixel output Vout is low, the column amplifier 501 amplifies the signal by a gain of 8 so as to perform the AD conversion with high resolution. In contrast, in a case where the level of the pixel output Vout is high, the column amplifier 501 applies no gain to the signal so as to perform the AD conversion with low resolution. Since the column amplifier 501 applies no gain to the high-level pixel output Vout, the AD conversion value obtained is ⅛ of the AD conversion value of the low-level pixel output Vout. Thus, after the AD conversion is performed, the signal processing circuit 110 performs processing for applying a digital gain of 8 to the high-level pixel output Vout. In this way, the semiconductor device 500 can obtain pixel output values from the low level to the high level with a wide dynamic range.

A comparator 105 compares the pixel output Vout inputted via the column amplifier 501 with a predetermined threshold voltage Vsh and sets a gain of the column amplifier 501 based on the comparison result. Next, the comparator 105 compares an output Vamp from the column amplifier 501 with a reference signal from a reference signal generation circuit 106 and stores digital data in a storage unit 108, which is an operation similar to that in the first embodiment. In the present embodiment, however, the comparator 105 also sets information about a gain of the column amplifier 501 based on the result of the comparison between the pixel output Vout and the predetermined threshold voltage Vsh and stores this gain information in the storage unit 108. Based on this gain information, the signal processing circuit 110 performs the digital gain processing on the AD-converted signal.

As described above, the semiconductor device 500 according to the present embodiment achieves a wide dynamic range by combining the analog gain of the column amplifier 501 with the digital gain applied in the signal processing circuit 110. In the above example, in accordance with the high or low level of the pixel output Vout, the column amplifier applies an analog gain of 8, or the signal processing circuit applies a digital gain of 8.

Namely, when the column amplifier 501 does not apply any gain, the signal processing circuit 110 applies a digital gain equivalent to an analog gain value of the column amplifier 501. While the digital gain value applied in the signal processing circuit 110 is set to the same value as the analog gain set value of the column amplifier 501, the actual gain value of the column amplifier 501 may differ from its set value. This is because the analog gain value of the column amplifier has an individual difference due to manufacturing variations and also varies depending on the temperature during operation. Unless the digital gain processing is performed based on an accurate analog gain value, the linearity of the output value outputted from the semiconductor device 500 cannot be maintained. Thus, when the digital gain is applied in the signal processing circuit 110, an accurate analog gain value of the column amplifier 501 needs to be obtained for each individual and for each temperature to be used in the signal processing.

The present embodiment uses a correction value output circuit 502 to obtain an accurate analog gain value of the column amplifier for each individual and for each temperature.

First, a configuration of the correction value output circuit 502 will be described with reference to FIG. 6. The correction value output circuit 502 includes a voltage generator 503, a voltage follower 603, an amplifier 604, comparators 605a and 605b and storage units 606a and 606b.

The voltage generator 503 is configured to generate a reference voltage by using only passive elements, namely, without using active elements. The voltage generator 503 generates an analog reference voltage Vvol by dividing a power supply voltage by resistive elements and outputs the generated reference voltage. The voltage generator 503 includes, for example, resistive elements R4 and R5 whose resistance values are r4 and r5, respectively, a voltage follower 601 which has a gain of 1, and a switch 602. A power supply voltage Vdd is divided by the resistances R4 and R5 at a ratio of r4:r5 and inputted to the voltage follower 601 as a voltage Vvol expressed by equation (8). The voltage Vvol corresponds to a voltage generated by the voltage generator 503.

$$Vvol = r5/(r4+r5) \times Vdd \quad (8)$$

Namely, the voltage inputted to the voltage follower 601 is determined by the ratio of the resistances R4 and R5. Since the amount of variation in the resistance value due to manufacturing variations is typically equal between the neighboring resistive elements, even when the resistance value itself changes, the ratio of the resistance values r4 and r5 in the voltage generator 503 does not change, and an approximately constant voltage value is always inputted to the voltage follower 601. The voltage follower 601 has high input impedance and outputs the voltage value equal to the input voltage value expressed by the equation (8).

A Switch 602 determines whether to connect the output from the voltage follower 601 to the subsequent stage. The switch 602 is controlled to be turned on or off at predetermined timing by a pulse signal from a timing generator (not illustrated).

The output from the voltage follower 601 is connected to the voltage follower 603 (a first amplifier) and to the amplifier 604 (a second amplifier) via the switch 602. As with the voltage follower 601, the voltage follower 603 has high input impedance and outputs a voltage equal to the input voltage. The voltage follower 603 can be regarded as the amplifier having a fixed gain of 1. The amplifier 604, which is an amplifier having a variable gain, has the same configuration as the column amplifier 501 arranged in the semiconductor device 500. The amplifier 604 includes, for example, a plurality of capacitors C1 to C3 and a plurality of switches SW1 to SW3. The amplifier 604 can be reset to the initial state and change its gain by operating the switches SW1 to SW3. The number of the capacitors and the switches illustrated in FIG. 6 is merely an example.

The outputs of the voltage follower 603 and the amplifier 604 are connected to the comparators 605a and 605b. The comparators 605a and 605b and the storage units 606a and 606b have the same configurations as the comparator 105 and storage unit 108 illustrated in FIG. 1. The analog values outputted from the voltage followers 603 and the amplifier 604 are stored in the storage units 606a and 606b as digital data. Namely, the comparator 605a, a reference signal generation circuit 106, a counter circuit 107, and the storage unit 606a constitute a first AD converter. In addition, the comparator 605b, the reference signal generation circuit 106, the counter circuit 107, and the storage unit 606b constitute a second AD converter.

The voltage follower 603 corresponds to the first amplifier that amplifies the Vvol (a first voltage) generated by the voltage generator 503 to a first analog value by a first gain. The amplifier 604 corresponds to the second amplifier that amplifies the Vvol (a first voltage) generated by the voltage generator 503 to a second analog value by a second gain. The first AD converter converts the first analog value into a first digital value. The second AD converter converts the second analog value into a second digital value.

Figure 6:
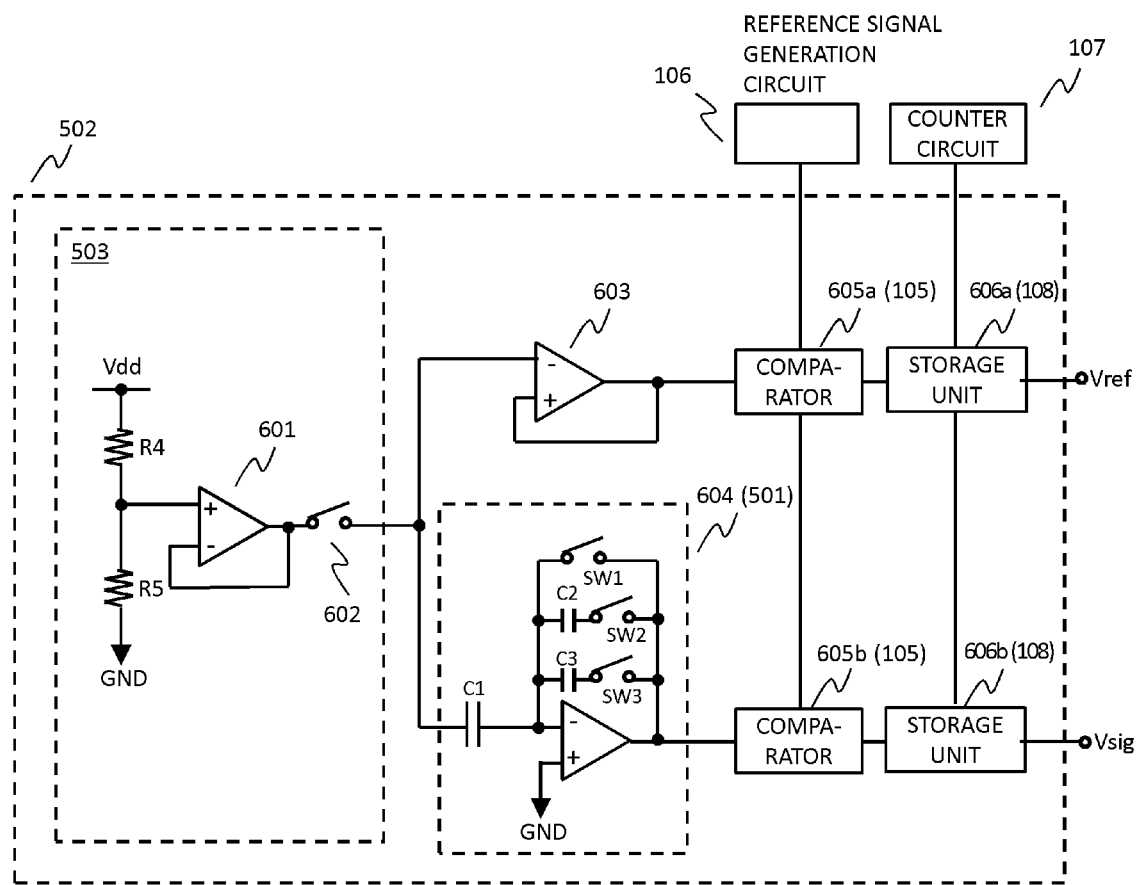
FIG. 6 is a circuit diagram of a correction value output circuit according to the second embodiment.

As illustrated in FIG. 6, data stored in the storage unit 606a will be referred to as Vref, and data stored in the storage unit 606b will be referred to as Vsig. The Vref corresponds to the first digital value, and the Vsig corresponds to the second digital value. As mentioned above, the analog gain value of the column amplifier 501 has an individual difference due to manufacturing variations and also varies depending on the temperature during operation. The correction value output circuit 502 can output a highly accurate correction value for correcting an analog gain error of each individual and at each temperature. Hereinafter, a method for calculating a correction value for correcting an analog gain error will be described.

Vref stored in the storage unit 606a is expressed by equation (9).

$$Vref = Vvol \times Gvf \times (AD \text{ gain error}) \times (AD \text{ conversion error}) \quad (9)$$

In this equation, Vvol is defined by the equation (8), and Gvf indicates a gain set value of the voltage follower 603. "AD gain error" indicates an AD gain error that occurs when the output value from the voltage follower 603 is AD-converted. "AD conversion error" indicates changes of the digital data due to the voltage fluctuations that occur when the AD conversion is performed.

Vsig stored in the storage unit 606b is expressed by equation (10).

$$Vsig = Vvol \times Gamp \times (\text{analog gain error}) \times (AD \text{ gain error}) \times (AD \text{ conversion error}) \quad (10)$$

In this equation, Gamp indicates a gain set value of the amplifier 604, and "analog gain error" indicates an analog gain error of the amplifier 604.

Vvol is a known value determined based on the ratio of the resistive elements in the voltage generator 503 and the power supply voltage. Since the voltage follower 603 has a fixed gain of 1, the gain set value Gvf of the voltage follower 603 is 1.

If a ratio between the equation (9) and the equation (10) is calculated, the term (AD gain error) and the term (AD conversion error) are cancelled, and thus, equation (11) is obtained.

$$Vsig/Vref = Gamp \times (\text{analog gain error}) \quad (11)$$

The semiconductor device 500 outputs a digital value (a third digital value) obtained by AD-converting an analog value outputted from a pixel and the ratio between Vsig (the first digital value) and Vref (the second digital value). The correction value output circuit 502 calculates and outputs the ratio between Vsig and Vref for each gain set value of the amplifier 604.

Thus, the output of the ratio between Vsig and Vref enables the circuit downstream to correct the digital pixel signal based on this ratio between Vsig and Vref. Specifically, the analog gain error can be corrected by using the ratio between Vsig and Vref (the actual measured value) and its set value (Gamp). While the analog gain error is corrected, the AD gain error is also corrected. In this way, the impact of the AD gain error and the AD conversion error is offset or reduced, and the analog gain error for correcting the analog gain can be obtained. Thus, according to the present embodiment, by using the value of the analog gain error, the analog gain error of each individual and at each temperature can be corrected.

Instead of outputting the ratio of Vref and Vsig, the semiconductor device 500 may individually output Vref and Vsig or output a signal of a different value calculated based on Vref and Vsig. In addition, the signal processing circuit 110 in the semiconductor device 500 may perform the correction of the analog gain error.

As in FIG. 1, FIG. 6 merely illustrates a specific example for implementing the present disclosure, and FIG. 6 should not be construed as limiting the technical scope of the present disclosure.

Modification of Second Embodiment

Figure 7:
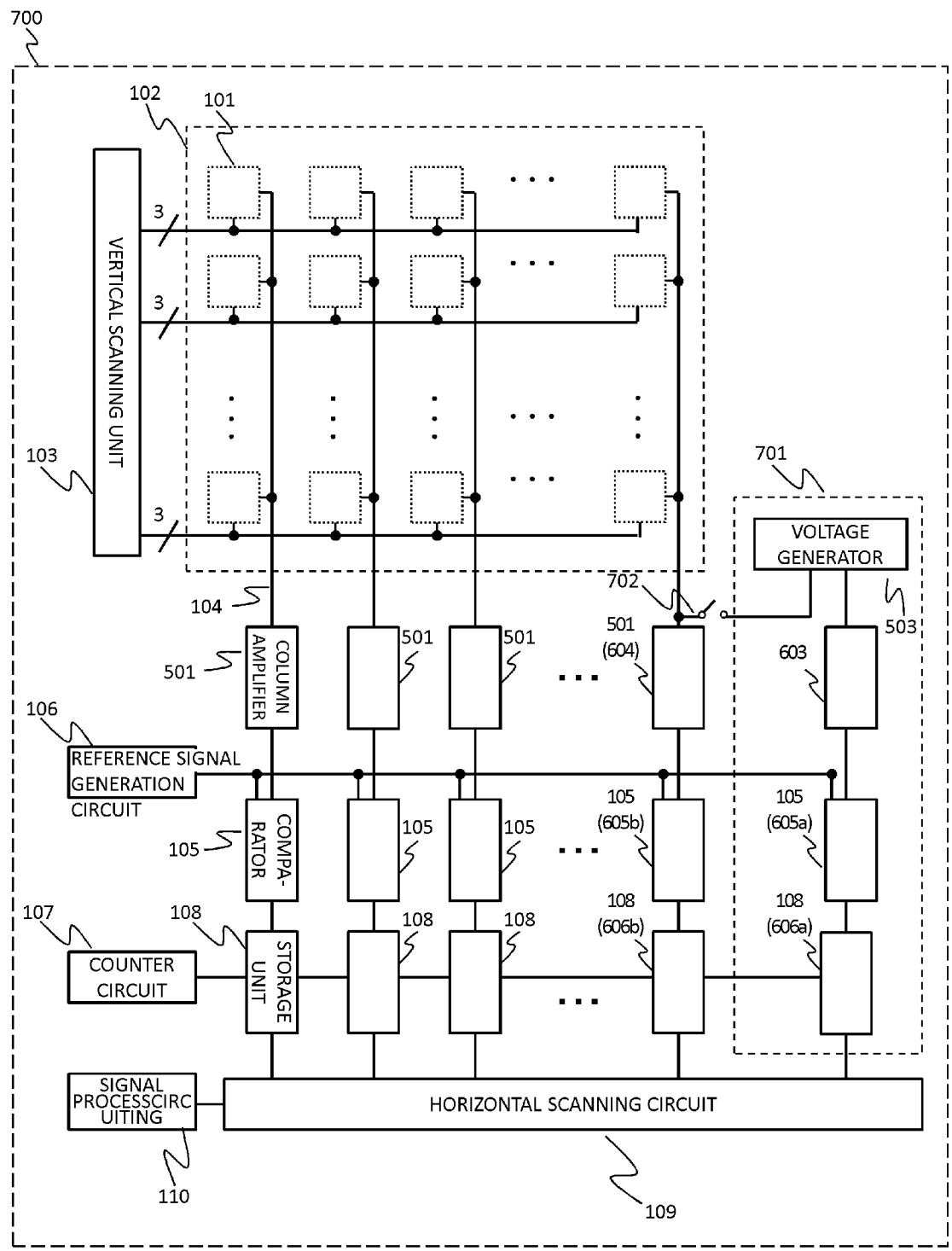
FIG. 7 is a circuit diagram of a semiconductor device according to a modification of the second embodiment.

A modification of the semiconductor device 500 will be described with reference to FIG. 7. Hereinafter, a semiconductor device 700 according to the present modification will be described mainly focusing on differences from the semiconductor device 500 according to the second embodiment, and descriptions of portions common to the semiconductor device 500 will be omitted.

The semiconductor device 700 includes a correction value output circuit 701 and a switch 702. The correction value output circuit 701 is similar to the correction value output circuit 502 in that the correction value output circuit 701 includes a voltage generator 503, a voltage follower 603, a comparator 605a, and a storage unit 606a. However, the correction value output circuit 701 does not include an amplifier 604, a comparator 605b, and a storage unit 606b. In addition, a set of an amplifier 704, a comparator 705, and a storage unit 708 used for amplifying, AD-converting, and storing a pixel signal (a pixel value) is also used for outputting a correction value. The amplifier 704, the comparator 705, and the storage unit 708 have the same configurations as the column amplifier 501, the comparator 105, and the storage unit 108, respectively. The switch 702 selectively connects either the voltage generator 503 or the signal generator 102 to the amplifier 704.

In the present modification, Vvol outputted from the voltage generator 503 is inputted to the column amplifier 501, the comparator 105, and the storage unit 108, which are usually used for AD-converting the pixel signal from the signal generator 102 via the switch 702. A method for correcting the analog gain error of each individual is the same as that described in the second embodiment. In this way, the space in the semiconductor device can be saved.

Third Embodiment

FIG. 8 is a block diagram illustrating a configuration of an imaging system 800 according to a third embodiment. The imaging system 800 according to the present embodiment includes a semiconductor device 801 (an imaging device) that has any one of the configurations of the semiconductor devices described in the above embodiments. Specific examples of the imaging system 800 include a digital still camera, a digital camcorder, a monitoring camera, etc. FIG. 8 illustrates a configuration example of a digital still camera that uses any one of the semiconductor devices in the above embodiments.

The imaging system 800 illustrated in FIG. 8 includes a semiconductor device 801, a lens 802 for forming an optical image of a subject on the semiconductor device 801, and a diaphragm 803 for varying the amount of light that passes through the lens 802. The lens 802 and the diaphragm 803 are an optical system that condenses light onto the semiconductor device 801.

The imaging system 800 also includes a signal processing unit 804 that performs processing on an output signal outputted from the semiconductor device 801. The signal processing unit 804 performs signal processing in which, as needed, various corrections and compression are performed on an input signal and the processed signal is outputted.

The imaging system 800 further includes a buffer memory unit 805 for temporarily storing image data and an external interface unit (hereinafter, referred to as an external I/F unit) 806 for communicating with an external computer or the like. The imaging system 800 also includes a recording medium 807 such as a semiconductor memory for recording or reading image data and a recording medium control interface unit (hereinafter, referred to as recording medium control I/F unit) 808 for recording or reading the recording medium 807. The recording medium 807 may be incorporated in the imaging system 800 or detachably provided.

The imaging system 800 includes an overall control and calculation unit 809 that performs various calculations and controls overall operations of the digital still camera and a timing generator 810 that outputs various timing signals to the semiconductor device 801 and the signal processing unit 804. Alternatively, the timing signals or the like may be inputted from outside, and the imaging system 800 may at least include the semiconductor device 801 and the signal processing unit 804 that processes an output signal outputted from the semiconductor device 801. The overall control and calculation unit 809 and the timing generator 810 may be configured to implement a part or all of the control functions of the semiconductor device 801.

The semiconductor device 801 outputs an image signal and AD gain error information or analog gain error information, which is obtained from a correction value output circuit provided in the semiconductor device 801, to the signal processing unit 804. The signal processing unit 804 corrects the gain of the semiconductor device 801 based on the above gain error information outputted from the semiconductor device 801, performs the predetermined signal processing on the image signal, and outputs image data. The imaging system 800 may include a driving device, such as a motor or an actuator, for driving (moving, displacing, deforming) an object. The imaging system 800 may include a processing apparatus that obtains information from the signal outputted from the semiconductor device 801 and a control apparatus that controls the driving device such as a motor based on the information. A first driving device such as a motor can drive the lens 802 for an automatic focusing operation based on information (ranging information) obtained from the signal outputted from the semiconductor device 801. A second driving device such as a motor can drive the diaphragm 803 for an automatic exposure operation based on information (photometric information) obtained from the signal outputted from the semiconductor device 801. A third driving device such as a motor can drive the semiconductor device 801 for a vibration control (image stabilization) based on information obtained from the signal outputted from the semiconductor device 801.

For example, in a case of the semiconductor device having the configuration illustrated in FIG. 3, the signal processing unit 804 calculates the AD gain error information based on the ratio between Vsiga and Vsigb and corrects the AD gain error. Specifically, the signal processing unit 804 calculates a gradient of the ramp waveform based on the ratio between Vsiga and Vsigb and obtains a deviation amount from the set value of the AD gain.

In a case of the semiconductor device having the configuration illustrated in FIG. 6, the signal processing unit 804 calculates the analog gain error information based on the ratio between Vref and Vsig and corrects the analog gain error. Specifically, the signal processing unit 804 offsets the AD conversion error based on the ratio between Vref, which is a known value, and Vsig and obtains a deviation amount from the set value of the amplifier gain. Since the ratio between Vref and Vsig is obtained for each gain set value of the amplifier 604 in the correction value output circuit 502, the signal processing unit 804 corrects the gain by using the ratio between Vref and Vsig corresponding to the gain of the column amplifier 501.

Depending on the configuration of the semiconductor device, the AD gain error and the analog gain error may be calculated in the semiconductor device 801 based on Vsiga, Vsigb, Vref, and Vsig. In such a case, the signal processing unit 804 corrects the AD gain error or the analog gain error by using the AD gain error information or the analog gain error information calculated in the semiconductor device 801. Alternatively, the gain correction processing itself may also be performed in the semiconductor device 801.

The imaging system capable of obtaining an image with better quality can be achieved by configuring the imaging system with any one of the semiconductor devices according to the above embodiments.

Fourth Embodiment

Figure 9A:
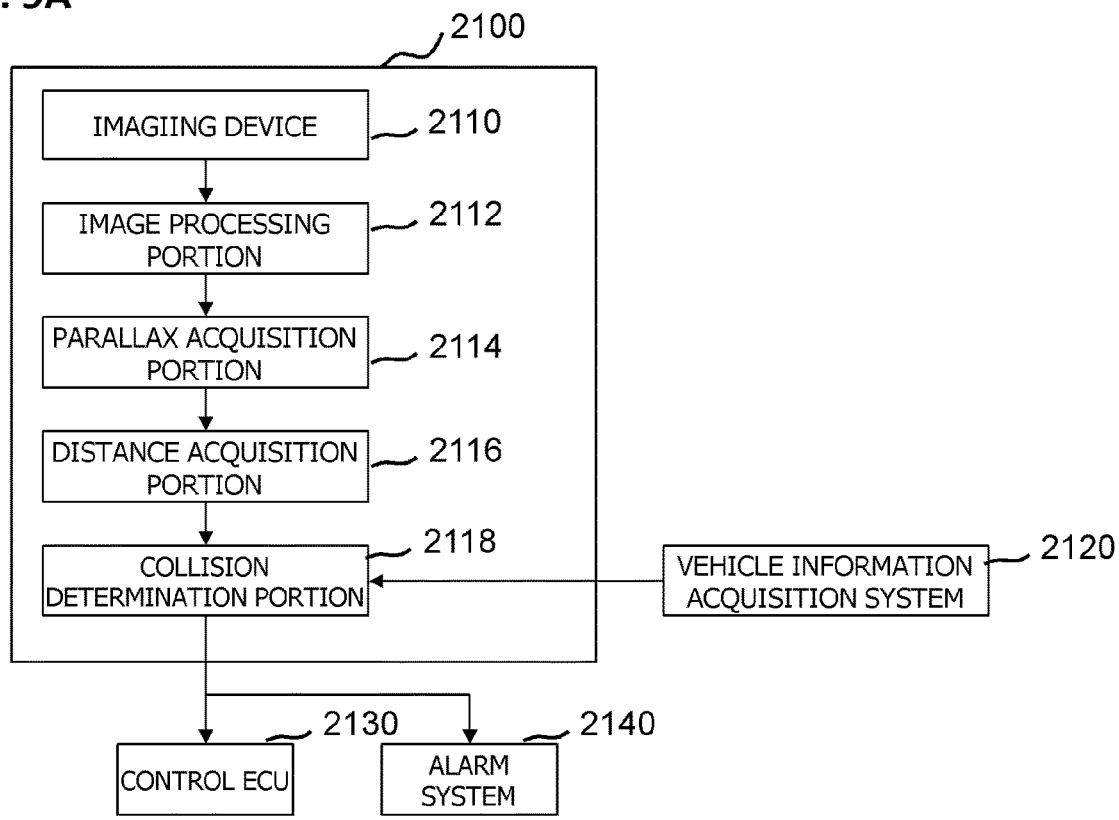
FIGS. 9A and 9B illustrate configurations of an imaging system and transportation equipment according to a fourth embodiment.
Figure 9B:
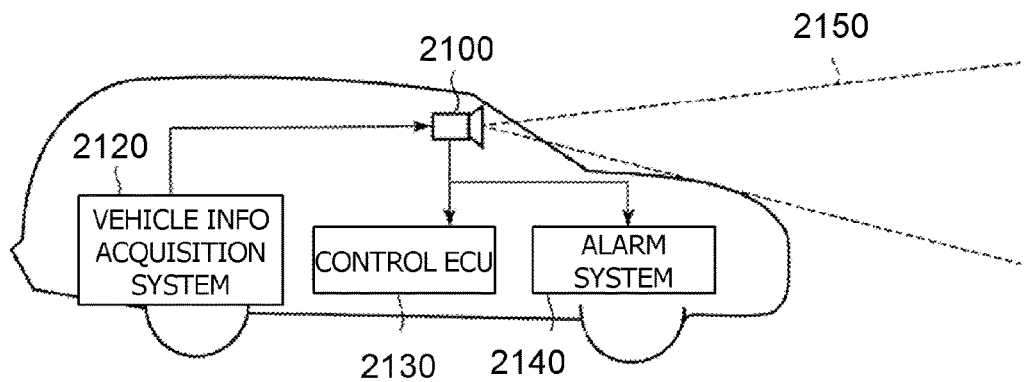

A system (for example, an imaging system) and equipment (for example, transportation equipment) according to a fourth embodiment of the present disclosure will be described with reference to FIGS. 9A and 9B. FIGS. 9A and 9B illustrate configurations of an imaging system and transportation equipment according to the present embodiment.

FIG. 9A illustrates an example of an imaging system 2100 related to an in-vehicle camera. The imaging system 2100 includes a semiconductor device 2110. The semiconductor device 2110 is any one of the semiconductor devices described in the above first and second embodiments. The imaging system 2100 includes an image processing unit 2112 and a parallax acquisition unit 2114. The image processing unit 2112 is a processing apparatus that performs image processing on a plurality of image data acquired by the semiconductor device 2110. The processing performed by the image processing unit 2112 includes gain correction processing based on a correction value outputted from the semiconductor device 2110. The parallax acquisition unit 2114 is a processing apparatus that calculates parallax (a phase difference between parallax images) based on a plurality of image data acquired by the semiconductor device 2110. In addition, the imaging system 2100 includes a distance acquisition unit 2116 which is a processing apparatus that calculates a distance to a target object based on the calculated parallax and a collision determination unit 2118 which is a processing apparatus that determines whether there is a possibility of collision based on the calculated distance. The parallax acquisition unit 2114 and the distance acquisition unit 2116 are examples of information acquisition means for acquiring information such as information about a distance to a target object or the like. Namely, the distance information is information related to parallax, a defocus amount, a distance to a target object, and the like. The collision determination unit 2118 may determine the possibility of collision by using any of the above distance information. The processing apparatus described above may be achieved by specially designed hardware or by general-purpose hardware that performs calculation in accordance with a software module. Alternatively, the processing apparatus may be achieved by a field programmable gate array (FPGA), an application specific integrated circuit (ASIC), etc. or by a combination thereof.

The imaging system 2100 is connected to a vehicle information acquisition device 2120 and can acquire vehicle information such as a vehicle speed, a yaw rate, and a steering angle. In addition, the imaging system 2100 is connected to a control ECU 2130 which is a control apparatus that outputs a control signal for causing a vehicle to generate a braking force based on the determination result by the collision determination unit 2118. Namely, the control ECU 2130 is an example of transportation equipment control means for controlling the transportation equipment based on the distance information. The imaging system 2100 is also connected to a warning device 2140 that issues an alert to a driver based on the determination result by the collision determination unit 2118. For example, in a case where the collision determination unit 2118 obtains a determination result in which the possibility of collision is high, the control ECU 2130 controls the vehicle to apply a brake, release an accelerator, reduce an engine output, or the like to avoid collision and reduce damage. The warning device 2140 alerts the user by sounding an alert such as an alarm sound, displaying warming information on a screen of a car navigation system or the like, applying vibration to a seat belt or a steering, etc.

According to the present embodiment, the imaging system 2100 captures an image of the surroundings, for example, the front side or the rear side of the vehicle. FIG. 9B illustrates the imaging system 2100 capturing an image of the front side of the vehicle (an imaging area 2150). The vehicle information acquisition device 2120 transmits an instruction to cause the imaging system 2100 to operate and perform image capturing. By using the semiconductor device according to the first or second embodiment described above as the semiconductor device 2110, the imaging system 2100 according to the present embodiment can improve the accuracy of the distance measurement.

While the example of the control operation to avoid collision with another vehicle has been described, the imaging system 2100 is applicable to a control operation to perform automatic driving to follow a preceding vehicle, a control operation to perform automatic driving without deviating from a lane, and the like. Furthermore, the imaging system 2100 is applicable not only to a vehicle such as an automobile but also to, for example, transportation equipment (a mobile body) such as a ship, an aircraft, and an industrial robot. A driving device of the transportation equipment is a power source such as an engine, a motor, a wheel, and a propeller. In addition, the imaging system 2100 is applicable not only to the transportation equipment but also to equipment that widely uses object recognition such as the intelligent transport systems (ITS). According to the present disclosure, an advantageous technique for improving the accuracy of AD conversion can be provided.

OTHER EMBODIMENTS

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-013956, filed Jan. 30, 2020 which is hereby incorporated by reference herein in its entirety.

What is claimed is:

1. A semiconductor device comprising:
a voltage generator configured to generate a voltage;
a first analog-to-digital (AD) converter configured to convert an analog value based on a voltage generated by the voltage generator into a first digital value;
a second AD converter configured to convert an analog value based on a voltage generated by the voltage generator into a second digital value;
a signal generator configured to generate a signal corresponding to an input from outside;
a third AD converter configured to convert an analog value based on the signal into a third digital value; and a signal processing circuit configured to correct the third digital value based on a ratio between the first digital value and the second digital value.

2. The semiconductor device according to claim 1, wherein the first AD converter and the second AD converter simultaneously perform AD conversion to obtain the first digital value and AD conversion to obtain the second digital value.

3. The semiconductor device according to claim 1, wherein the voltage generator generates voltages by dividing a power supply voltage by resistive elements.

4. The semiconductor device according to claim 1, wherein a voltage source of the voltage generator is different from a voltage source of the signal generator.

5. The semiconductor device according to claim 1, wherein the semiconductor device outputs the third digital value, the first digital value, and the second digital value or outputs the third digital value and a value based on the first digital value and the second digital value.

6. The semiconductor device according to claim 3, wherein
the voltage generator is configured to generate a first voltage and a second voltage by dividing the power supply voltage by resistive elements,
the first AD converter is configured to convert a first analog value based on the first voltage into the first digital value, and
the second AD converter is configured to convert a second analog value based on the second voltage into the second digital value.

7. The semiconductor device according to claim 6, comprising at least one of a switch configured to selectively connect either the voltage generator or the signal generator to the first AD converter and a switch configured to selectively connect either the voltage generator or the signal generator to the second AD converter.

8. The semiconductor device according to claim 3, comprising:
a first amplifier configured to amplify a voltage generated by the voltage generator to a first analog value by a first gain; and
a second amplifier configured to amplify a voltage generated by the voltage generator to a second analog value by a second gain,
wherein the first AD converter is configured to convert the first analog value into the first digital value, and
wherein the second AD converter is configured to convert the second analog value into the second digital value.

9. The semiconductor device according to claim 8, wherein the first gain is 1 time.

10. The semiconductor device according to claim 8, comprising a third amplifier configured to amplify a voltage generated by the signal generator to a third analog value by a third gain, wherein the third AD converter converts the third analog value into a third digital value.

11. The semiconductor device according to claim 10, comprising a switch configured to selectively connect either the voltage generator or the signal generator to the second AD converter.

12. The semiconductor device according to claim 10, wherein the third amplifier has a variable gain.

13. The semiconductor device according to claim 8, wherein the first amplifier has a fixed gain and the second amplifier has a variable gain.

14. The semiconductor device according to claim 8, wherein
an input node of the first amplifier is electrically connected to between a power supply voltage node and one of the resistive elements, and
an input node of the second amplifier is electrically connected to between a ground voltage node and the one of the resistive elements.

15. The semiconductor device according to claim 1, wherein the signal generator is a pixel array.

16. The semiconductor device according to claim 1, wherein the voltage generator includes no active elements.

17. A device comprising:
a semiconductor device according to claim 1;
a driving device, communicably connected with the semiconductor device, that drives an object;
a processing apparatus, communicably connected with the semiconductor device, that acquires information from a signal outputted from the semiconductor device; and
a control apparatus, communicably connected with the semiconductor device, that controls the driving device based on the information.

18. The semiconductor device according to claim 1, wherein
the first AD converter configured to compare the analog value with a reference signal having a ramp waveform, and
the second AD converter configured to compare the analog value with the reference signal having the ramp waveform.

19. A system comprising:
a signal generator configured to generate a signal corresponding to an input from outside;
a voltage generator configured to generate a voltage;
a first AD converter configured to convert an analog value base on a voltage generated by the voltage generator into a first digital value;
a second AD converter configured to convert an analog value based on a voltage generated by the voltage generator into a second digital value; and
a third AD converter configured to convert an analog value based on the signal generated by the signal generator into a third digital value,
wherein the third digital value is corrected based on a ratio between the first digital value and the second digital value.

20. A semiconductor device comprising:
a voltage generator configured to generate a voltage;
a first analog-to-digital (AD) converter configured to convert an analog value based on a voltage generated by the voltage generator into a first digital value;
a second AD converter configured to convert an analog value based on a voltage generated by the voltage generator into a second digital value;
a first amplifier configured to amplify a voltage generated by the voltage generator to a first analog value by a first gain; and
a second amplifier configured to amplify a voltage generated by the voltage generator to a second analog value by a second gain,
wherein the voltage generator generates voltages by dividing a power supply voltage by resistive elements,
wherein the first AD converter is configured to convert the first analog value into the first digital value,
wherein the second AD converter is configured to convert the second analog value into the second digital value,
wherein an input node of the first amplifier is electrically connected to between a power supply voltage node and one of the resistive elements, and wherein an input node of the second amplifier is electrically connected to between a ground voltage node and the one of the resistive elements.

21. The semiconductor device according to claim 20, further comprising:
   a signal generator configured to generate a signal corresponding to an input from outside; and
   a third AD converter configured to convert an analog value based on the signal into a third digital value.

22. The semiconductor device according to claim 20, wherein
   the first AD converter configured to compare the analog value with a reference signal having a ramp waveform, and
   the second AD converter configured to compare the analog value with the reference signal having the ramp waveform.

23. A system comprising:
   a semiconductor device according to claim 21; and
   a signal processing circuit configured to correct the third digital value based on a ratio between the first digital value and the second digital value.

24. A system comprising:
   a semiconductor device according to claim 20; and
   a signal processing circuit configured to process a signal outputted from the semiconductor device.

* * * * *